United States Patent [19]

Shimizu et al.

[11] Patent Number: 5,306,521
[45] Date of Patent: Apr. 26, 1994

[54] PROCESS FOR MANUFACTURING DC SUPERCONDUCTING QUANTUM INTERFERENCE DEVICE

[75] Inventors: Nobuhiro Shimizu; Kazuo Chinone; Norio Chiba, all of Tokyo, Japan

[73] Assignee: Seiko Instruments Inc., Japan

[21] Appl. No.: 840,343

[22] Filed: Feb. 24, 1992

[30] Foreign Application Priority Data

Feb. 26, 1991 [JP] Japan ................................. 3-031073

[51] Int. Cl.$^5$ .................... H01L 39/24; G01R 33/035
[52] U.S. Cl. .......................................... 427/62; 427/63;
505/832; 505/846; 505/817; 156/656; 324/248;
257/31
[58] Field of Search ............... 505/832, 846, 817;
427/62, 63; 156/656; 357/5; 324/247, 248

[56] References Cited

U.S. PATENT DOCUMENTS 5,053,834 10/1991 Simmonds ............................. 357/5
5,142,229 8/1992 Marsden ............................. 324/248

FOREIGN PATENT DOCUMENTS 0147655 7/1985 European Pat. Off. .
0477495 4/1992 European Pat. Off. .
1-217981 8/1989 Japan .

OTHER PUBLICATIONS

Ketchen, et al., "Ultra-low-noise tunnel junction dc Squid with a tightly coupled planar input coil", Applied Physics Letters, vol. 40, No. 8, Apr. 15, 1982, pp. 736–738.

Cantor, et al., "Integrated DC Squid magnetometer with simplified read-out", Superconductor Science & Technology, vol. 3, No. 2, Feb., 1990, pp. 108–112.

*Primary Examiner*—Roy King
*Attorney, Agent, or Firm*—Bruce I. Adams; Van C. Wilks

[57] ABSTRACT

A method of manufacturing a DC superconducting quantum interference device comprises forming an insulating film over a portion of a resistance film. A lower electrode superconducting film is formed over the resistance film and the insulating film. A barrier layer is formed on a portion of the lower electrode superconducting film. An upper electrode is formed sandwiching the barrier layer between the lower electrode superconducting film and the upper electrode, so as to form a Josephson junction. To reduce the number of manufacturing steps, the lower electrode superconducting film is photolithographically patterned and/or etched to simultaneously form an input coil, a feedback coil and the Josephson junction. In another embodiment, after forming the upper electrode, an insulating film is formed over at least a portion of the lower electrode superconducting film. A superconducting film is formed over the insulating film in contact with the upper electrode. To reduce the number of manufacturing steps, the superconducting film is photolithographically patterned and/or etched to simultaneously form a counter electrode, the input coil and the feedback coil.

13 Claims, 10 Drawing Sheets

PROCESS FOR MANUFACTURING DC SUPERCONDUCTING QUANTUM INTERFERENCE DEVICE

BACKGROUND OF THE INVENTION

The present invention relates to a process for manufacturing a DC superconducting quantum interference device ("DC-SQUID"), which is applied to a highly sensitive magnetic sensor, an ammeter, a displacement meter, a high-frequency signal amplifier or the like.

Figure 1:
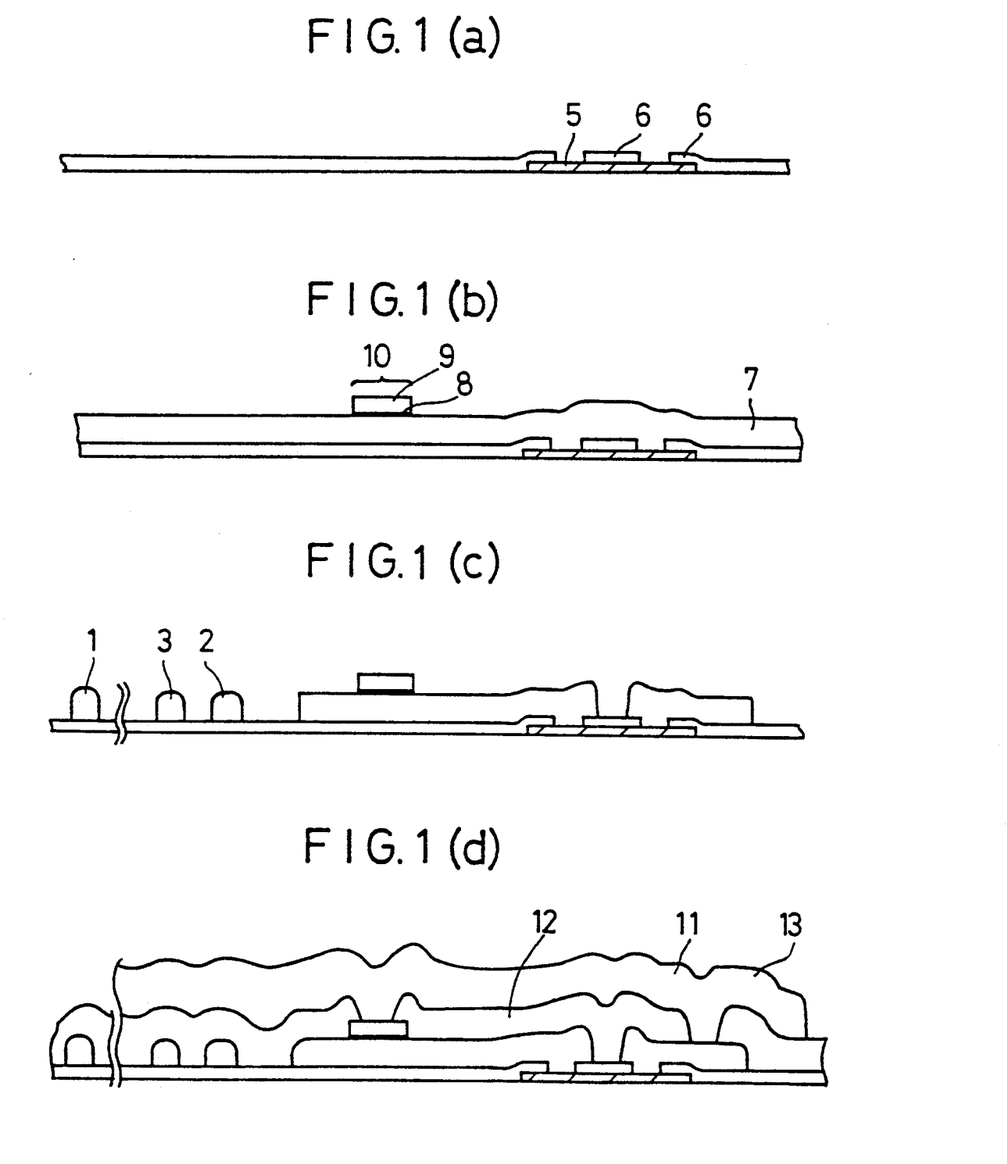
FIGS. 1(a), 1(b), 1(c) and 1(d) are sectional views showing the steps of a first embodiment of the present invention.
Figure 2A:
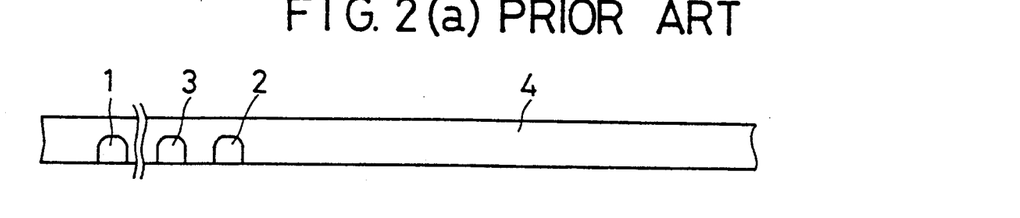
FIGS. 2(a), 2(b), 2(c), 2(d) and 2(e) are sectional views showing the steps of the prior art.

The steps of the prior art are shown in sections in FIGS. 2(a) to 2(e). These steps manufacture a SQUID integrated with a pick-up coil and begin fabricating a pick-up coil 1, a feedback coil 2 and an input coil 3 before the remaining steps. The individual steps will be briefly described in the following. FIG. 2(a) shows a step at which the surface is flattened with the first insulating film 4 after the pick-up coil 1, the feedback coil 2 and the input coil 3 are formed of a superconducting film. This superconducting film is formed by depositing Nb by sputtering, and the first insulating film 4 is flattened by applying SOG after $SiO_2$ has been deposited by plasma CVD.

Figure 2B:
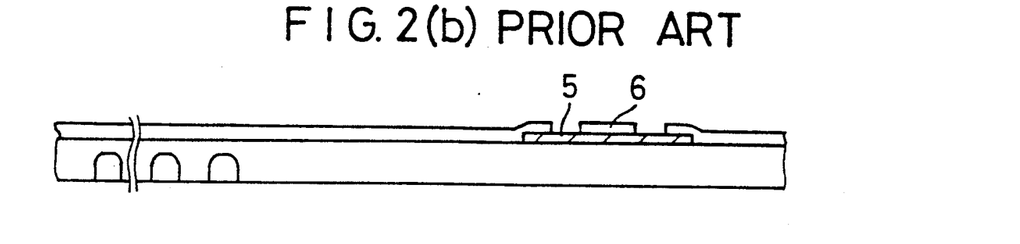

FIG. 2(b) shows a step at which a resistance film 5 for shunting or damping the SQUID is set to a designed value by a second insulating film 6 after it has been deposited. The resistance film 5 is made of Pd, and the second insulating film 5 is formed by evaporating MgO together.

Figure 2C:
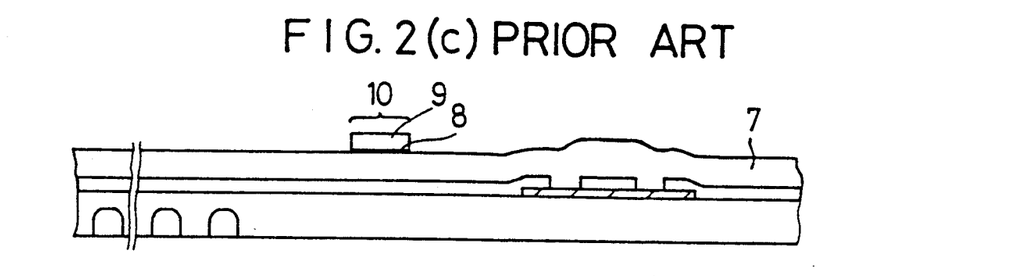
Figure 2D:
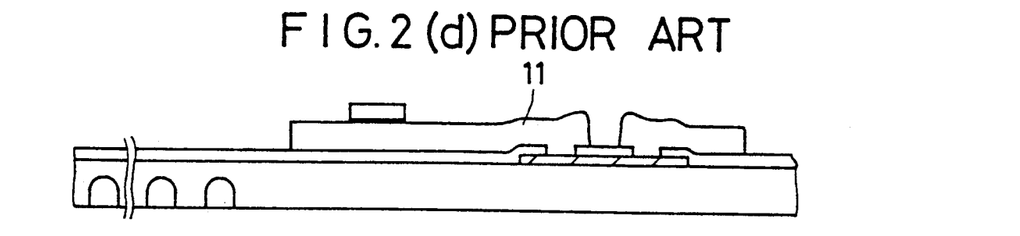

FIGS. 2(c) and 2(d) show steps at which a Josephson junction 10 and a washer coil 11 are fabricated. The Josephson junction 10 is formed by depositing a Nb/Al-oxide/Nb structure by sputtering. The washer coil 11 is formed of a lower electrode 7 of the Josephson junction 10.

Figure 2E:
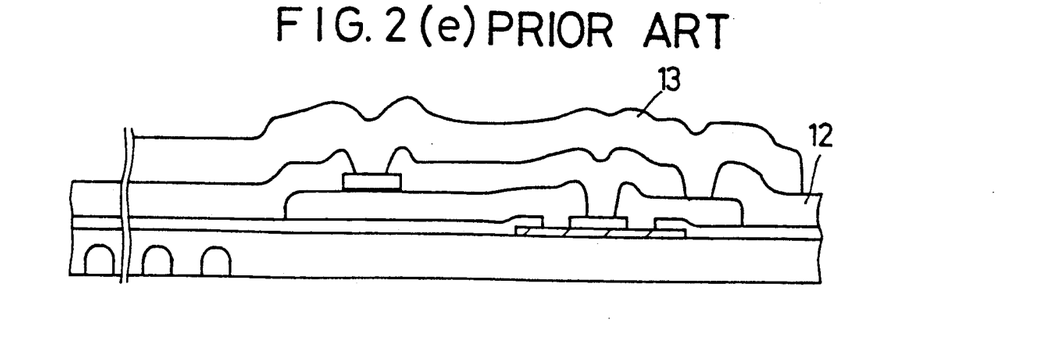

FIG. 2(e) shows a step at which an opposed electrode 13 of a superconducting film is formed after a third insulating film 12 has been deposited. The third insulating film 12 and the counter electrode 13 are deposited together, respectively, by evaporating SiO and PbIn.

According to the steps of FIG. 2, the pick-up coil 1, the feedback coil 2 and the input coil 3 are fabricated before the remaining steps so that the number of masks for patterning the deposited films by a photolithography increases. Since the number of steps increases, the time for the manufacture is elongated to reduce the production yield of the element.

SUMMARY OF THE INVENTION

It is an object of the present invention to provide a reduced steps and improved yield process for manufacturing a highly sensitive magnetic field detector.

In order to achieve the object, the feedback coil and the input coil are isotropically etched to have a tapered pattern thereby to eliminate the flattening step by the SOG. Moreover, at least one of the Josephson element and the counter electrode is fabricated simultaneously with the step of fabricating the input coil and the feedback coil.

Since the number of masks is reduced by the above-specified process, the number of steps can be reduced to manufacture a magnetic field detector having improved production yield and characteristics.

DETAILED DESCRIPTION OF THE PREFERRED EMBODIMENTS

Figure 3:
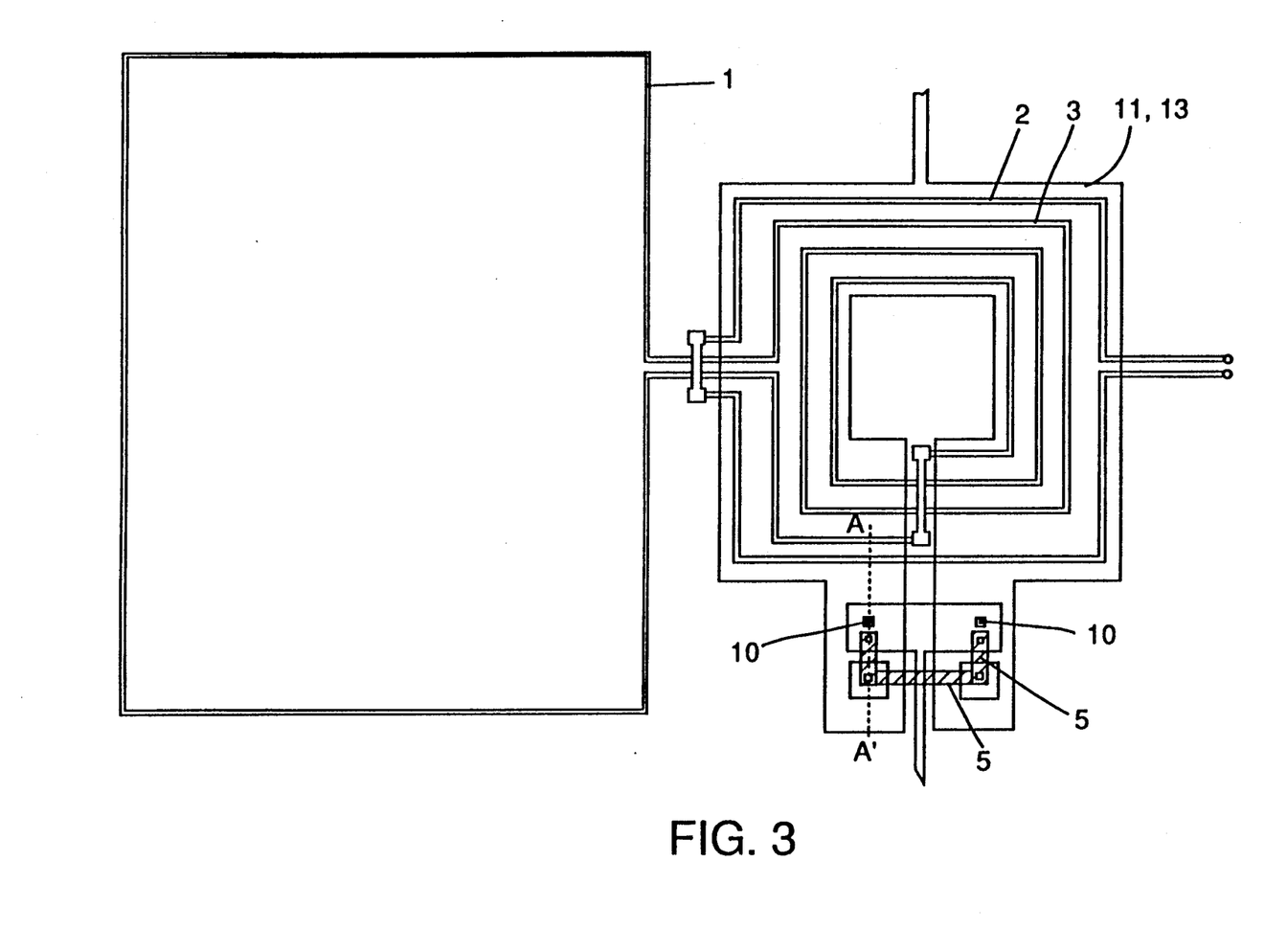
FIG. 3 is a top plan view showing the first embodiment of the present invention.
Figure 4A:
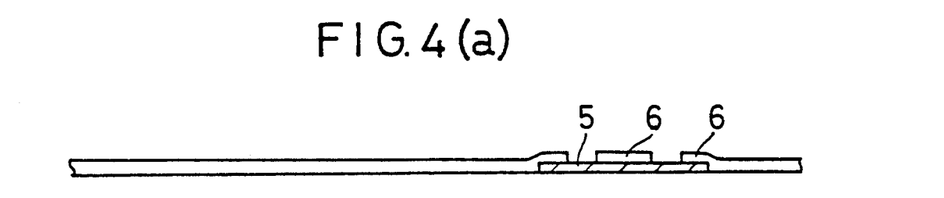
FIGS. 4(a), 4(b), 4(c) and 4(d) are sectional views showing the steps of a second embodiment of the present invention.
Figure 4B:
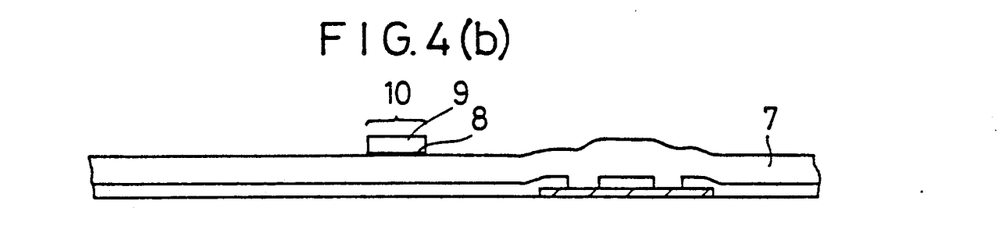
Figure 4C:
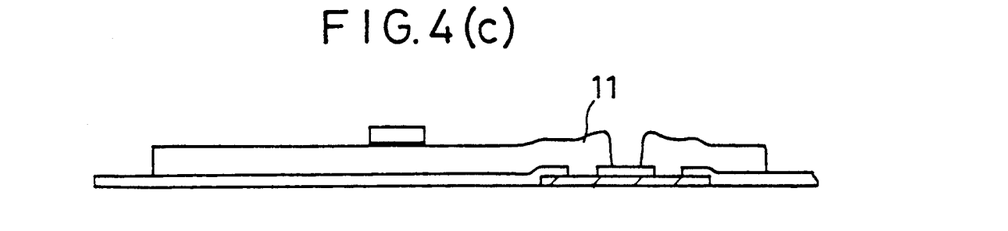
Figure 4D:
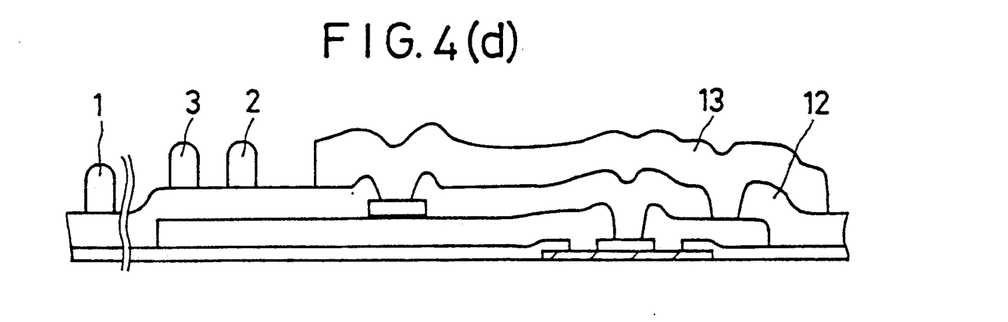

The present invention will be described in the following in connection with the embodiments thereof with reference to the accompanying drawings. FIG. 3 is a top plan view showing a first embodiment of the present invention. FIGS. 1(a) to 1(d) are sections taken along line A-A' of FIG. 3 and showing the steps. The manufacture process will be described with reference to FIGS. 1(a) to 1(d).

FIG. 1(a) shows a step at which a resistance film 5 for shunting or damping a DC-SQUID is insulated by a second insulating film 6 to have a designed resistance after it has been deposited. The resistance film 5 can be made of a metal such as Mo, MoN, Pd, Au, Cu, Al or Pd, any of which can be deposited by sputtering or evaporation. Here, Mo is deposited to a thickness of 100 nm by DC magnetron sputtering and is patterned to a designed size by a photolithographic step. The second insulating film 6 can be made of $SiO_2$, SiO, Si or MgO. Any of these materials can be deposited by sputtering, evaporation or CVD. The deposited film is set to be 1.5 to 2 times as thick as the resistance film 5 so as to insulate the resistance film 5 completely.

Here, the $SiO_2$ is deposited to 150 to 200 nm by RF magnetron sputtering and is enabled to contact with the resistance film 5 by the photolithographic step. Both the wet and dray etching methods can be used for etching the $SiO_2$. The wet etching is exemplified by a method using a mixture of hydrofluoric acid. The dry etching is exemplified by a reactive ion etching (i.e., RIE) using a mixture of $CF_4$ or $CHF_3$ and oxygen. Here, the $SiO_2$ is etched by the RIE using the mixture of $CHF_3$ and oxygen.

FIG. 1(b) shows a step for fabricating a Josephson junction 10, at which a lower electrode 7, a barrier layer 8 and an upper electrode 9 are deposited and at which the upper electrode 9 and the barrier layer 8 are etching by the photolithography. The Josephson junction 10 can be exemplified not only by the Nb/Al-oxide structure but also by a variety of structures of NbN/MgO/NbN, Nb/Si/Nb, Nb/Nb-oxed/Nb. Here, the Nb/Al-oxide/Nb structure is deposited by the sputtering. Examples of the deposition are as follows.

An argon gas is introduced into a reaction chamber, which is evacuated to a high vacuum of $10^{-5}$ Pa or less, and the Nb film of the lower electrode 7 is deposited under a pressure of 0.2 to 4 Pa by DC magnetron sputtering. The film is set to be about 1.5 to 2 times as thick as the second insulating film 6 and is deposited to 200 to 300 nm. Then, the introduction of the argon gas is interrupted, and the reaction chamber is evacuated to a high vacuum of $10^{-5}$ Pa or less. After this, the argon gas is introduced so that the Al is deposited to 1 to 20 nm under a pressure of 0.2 to 4 Pa by DC magnetron sputtering.

Here arises no problem unless the evacuation to a high vacuum is elaborately performed before the sputtering of the Al. The reaction chamber is evacuated to a high vacuum of $10^{-5}$ Pa or less, and an oxygen gas or a mixture of oxygen and argon is introduced to adjust the pressure to the set level. Then, the Al surface is oxidized to form the barrier layer 8 of AlOX/Al. The reaction chamber is evacuated to a high vacuum of $10^{-5}$ Pa or less, and the upper electrode 9 is deposited to 100 to 300 nm under the aforementioned Nb depositing condition. Next, the upper electrode 9 and the barrier layer 8 are etched at the photolithographic step to form the Josephson junction 10. The etching method used is generally the dry etching method using a plasma. The Nb of the upper electrode 9 is subjected to the reactive ion etching (i.e., RIE) using $CF_4$ or a mixture of $CF_4$ and oxygen. The Al of the barrier layer 8 is removed by either the wet etching method using an acid or the RIE using an Ar gas. Here, the barrier layer 8 need not be etched.

FIG. 1(c) shows a step, at which a detection coil 1, a feedback modulation coil 2 and an input coil 3 are formed by patterning the superconducting film deposited as the lower electrode 7 of the Josephson junction 10 by the photolithography. The etching method used is generally the dry etching method using plasma. The Nb of the lower electrode 7 is subjected to the plasma etching or reactive ion etching (i.e., RIE) using a mixture of $CF_4$ and oxygen. Here, the etching is so different from that of the aforementioned upper electrode 9 that the isotropic etching is effected by increasing the amount of oxygen and that the resist film in the peripheral of the pattern is etched with the oxygen into a tapered shape. The etching can be specifically exemplified by using the plasma etching apparatus with a gas, which is prepared by adding 10% of oxygen to the $CF_4$, under a pressure of 133 Pa and with a power of 50 W.

FIG. 1(d) shows a step, at which: a third insulating film 12 or an inter-layer insulating film is deposited. A contact hole is then formed by the photolithography, and a superconducting film is then deposited to form a washer coil 11 and an electrode 13 by the photolithography. The third insulating film 12 can be deposited by a method similar to that of the second insulating film 6. Here, the $SiO_2$ is deposited to 300 to 500 nm by RF magnetron sputtering, and the contact hole is formed by the photolithography. The etching of the $SiO_2$ is performed by RIE, like the formation of the second insulating film 6. The superconducting film is exemplified by Nb, NbN, Pb-In or Pn-In-Au which is deposited by the sputtering or evaporation. Here, the Nb film is deposited to 400 to 600 nm by, DC magnetron sputtering like the formation of the electrode of the Josephson junction. Before the deposition, the substrate is inversely sputtered with Ar gas so as to form the superconducting contact. After this, the washer coil 11, the counter electrode 13 and other wiring portions are formed by the photolithography. The etching is exemplified by plasma etching, like the formation of the aforementioned lower electrode 7.

Figure 5:
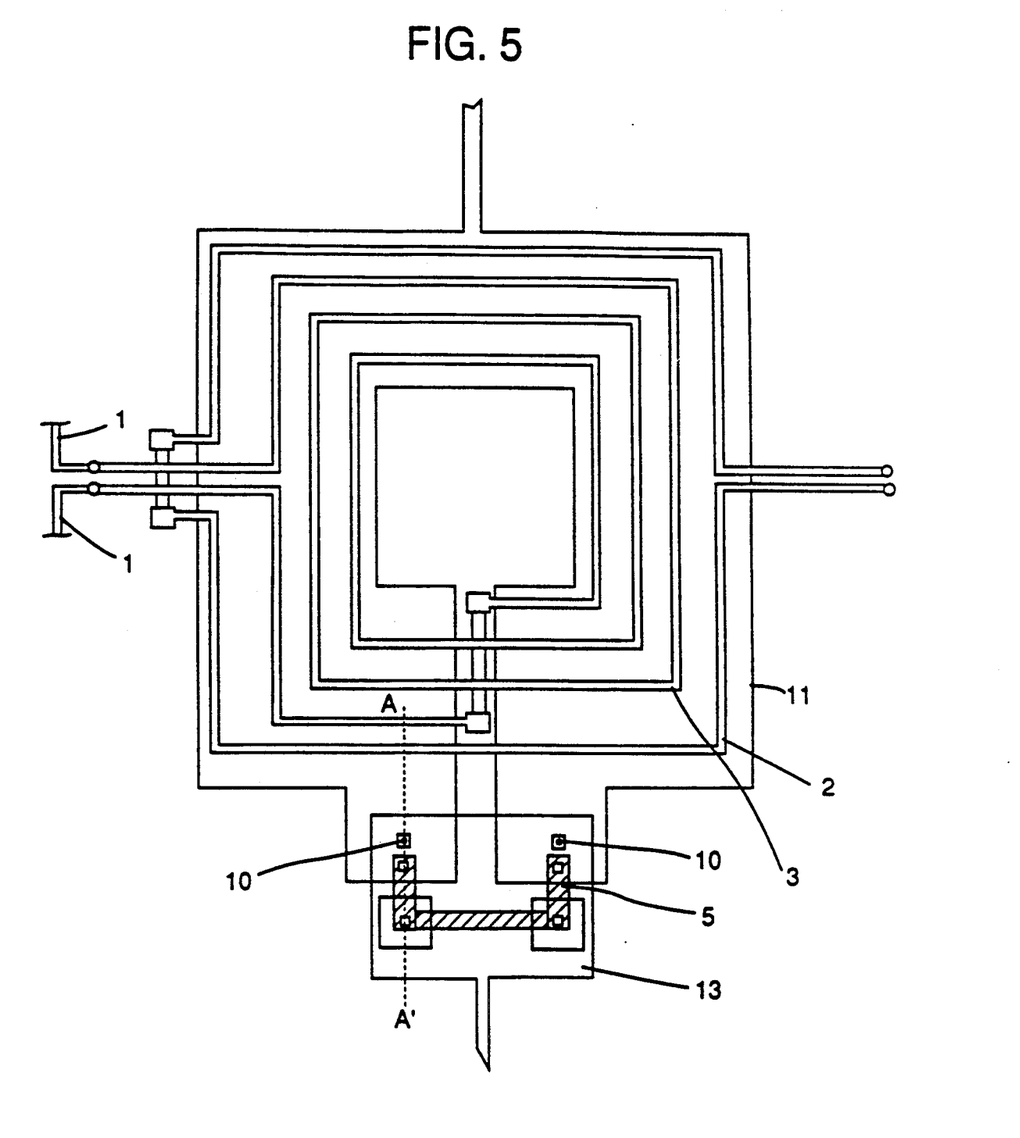
FIG. 5 is a top plan view showing the second embodiment of the present invention.
Figure 6A:
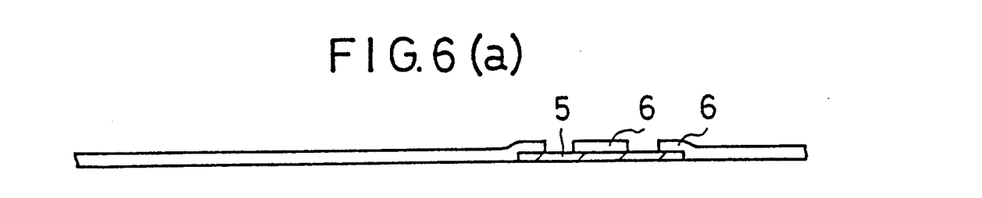
FIGS. 6(a), 6(b), 6(c) and 6(d) are sectional views showing the steps of a third embodiment of the present invention.
Figure 6B:
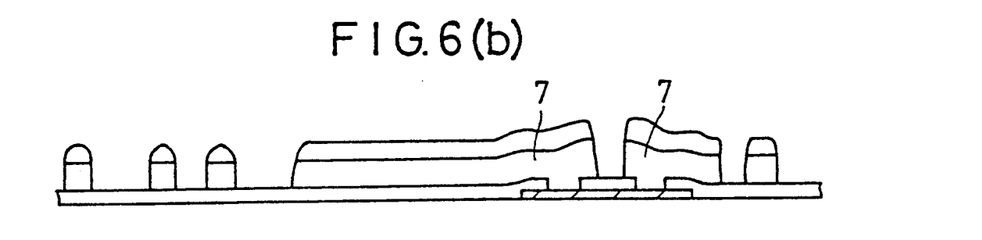
Figure 6C:
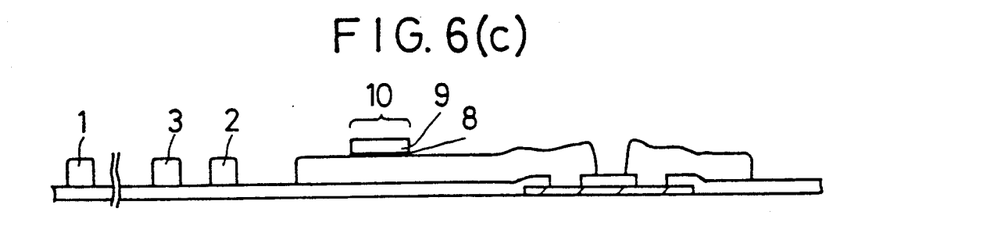
Figure 6D:
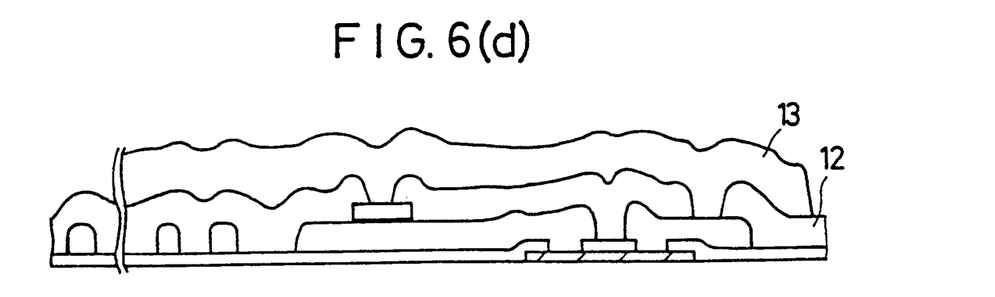
Figure 7A:
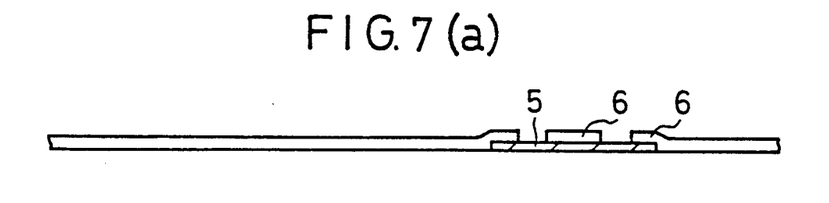
FIGS. 7(a), 7(b), 7(c) and 7(d) are sectional views showing the steps of a fourth embodiment of the present invention.
Figure 7B:
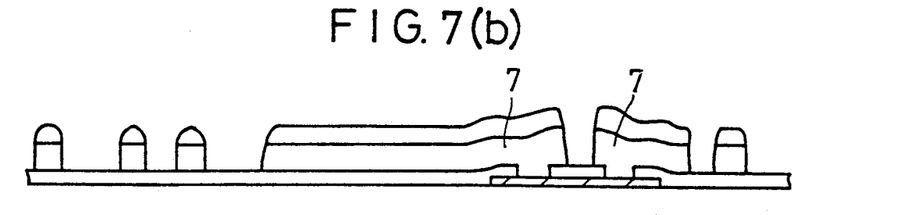
Figure 7C:
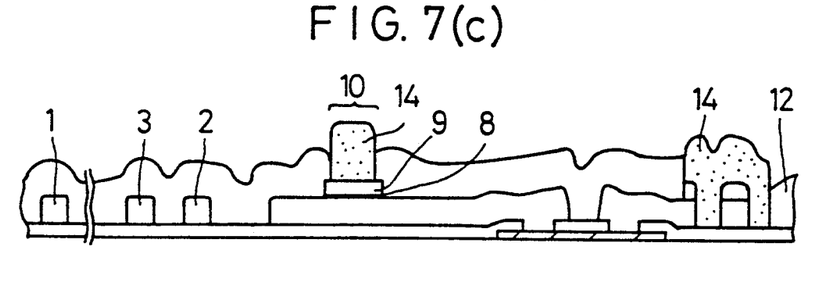
Figure 7D:
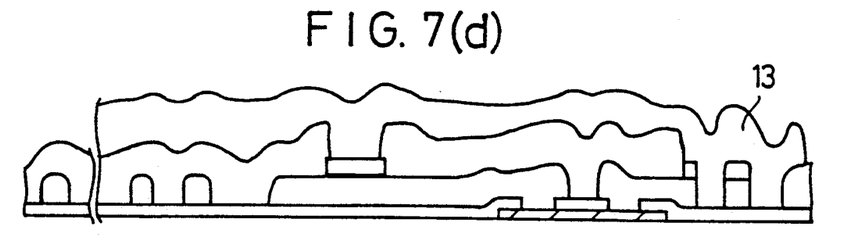

FIG. 5 is a top plan view showing a second embodiment of the present invention, from which the pick-up coil 1 is omitted. FIG. 4 is a section taken along line A-A' of FIG. 5. This method fabricates the counter electrode 13 simultaneously with the pick-up coil 1, the feedback coil 2 and the input coil 3, and the methods of fabricating the individual layers are similar to those of the first embodiment.

FIG. 6 presents sections showing the steps of a third embodiment. This manufacture process is different from the foregoing two embodiments in the method of forming the Josephson junction 10 such that the upper electrode 9 is formed after the etching has been performed beforehand up to the lower electrode 7. (FIGS. 6(b) and 6(c)) At this step, the second insulating film 6 has to be left unetched at the time of etching the upper electrode 9. In case the second insulating film used is made of $SiO_2$, SiO or Si, its surface is covered with Al, and oxide film of Al or MgO so that it may not be etched. FIG. 6 corresponds to the first embodiment of FIG. 1 but can also be applied to the second embodiment if the pick-up coil 1, the feedback coil 2 and the input coil 3 are fabricated at steps similar to those of the second embodiment.

FIG. 7 presents sections showing the steps of a fourth embodiment. This embodiment is a process for self-aligning the third insulating film 12 at a lift-off step. Specifically, the upper electrode 9 is etched by the RIE by using a photoresist as a mask, and the SiO is deposited by the evaporation and lifted off. Since the fourth embodiment is dispensed with the photolithography step for forming the contact hole in the third insulating film, the number of masks is further reduced to provide a manufacture process having less steps.

Although the several embodiments have been described, a number of other manufacture processes can be achieved by interchanging the order of the individual layers. For example, the last layer need not be tapered but may be patterned at the lift-off step. The resistance film 5 is fabricated at first but may be fabricated after the Josephson junction 10 has been fabricated. Since the pick-up coil 1 can be fabricated independently of other steps, it need not be fabricated together with the feedback coil 2 and the input coil 3. Moreover, they can be fabricated integrally in a common plane and can also be superconducting-connected after they have been separately fabricated. In the foregoing embodiments, the washer coil 11 may have its characteristics deteriorated because the Josephson junction 10 has its portion gapped to allow leakage of the magnetic flux. As a result, the characteristics are improved if the mask is increased to two in number to cover the gapped portion with the superconducting film.

The foregoing embodiments are exemplified by the DC-SQUID made of the single washer coil. If two washer coils are used, the magnetic field, which might otherwise go directly into them, can be canceled to detect the magnetic field in higher sensitivity with the detection coil. In the aforementioned individual embodiments of the DC-SQUID manufacturing steps, the DC-SQUID can have two washer coils.

Figure 8:
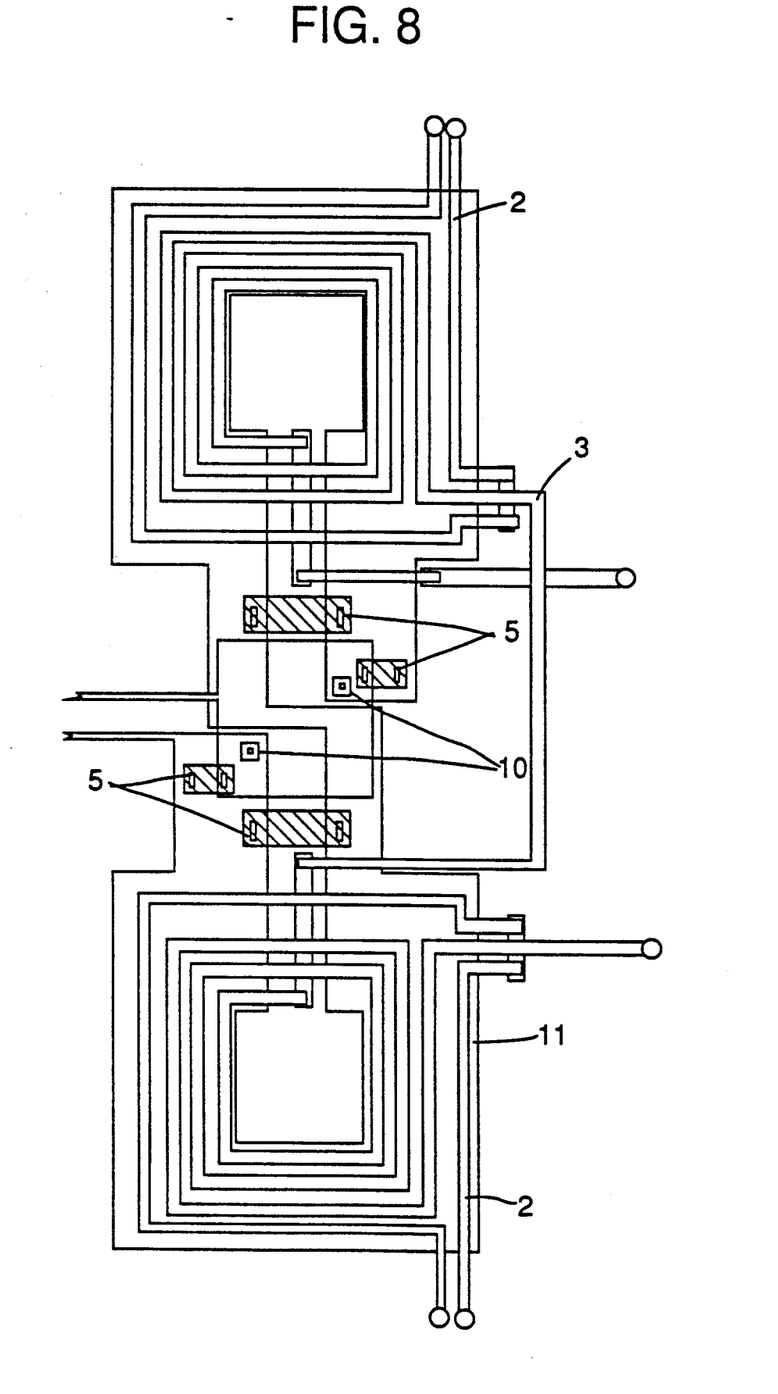
FIG. 8 is a top plan view of a DC-SQUID having double-washer coils connected in series.

FIG. 8 is a top plan view showing the DC-SQUID in which the washer coils are connected in series.

Figure 9:
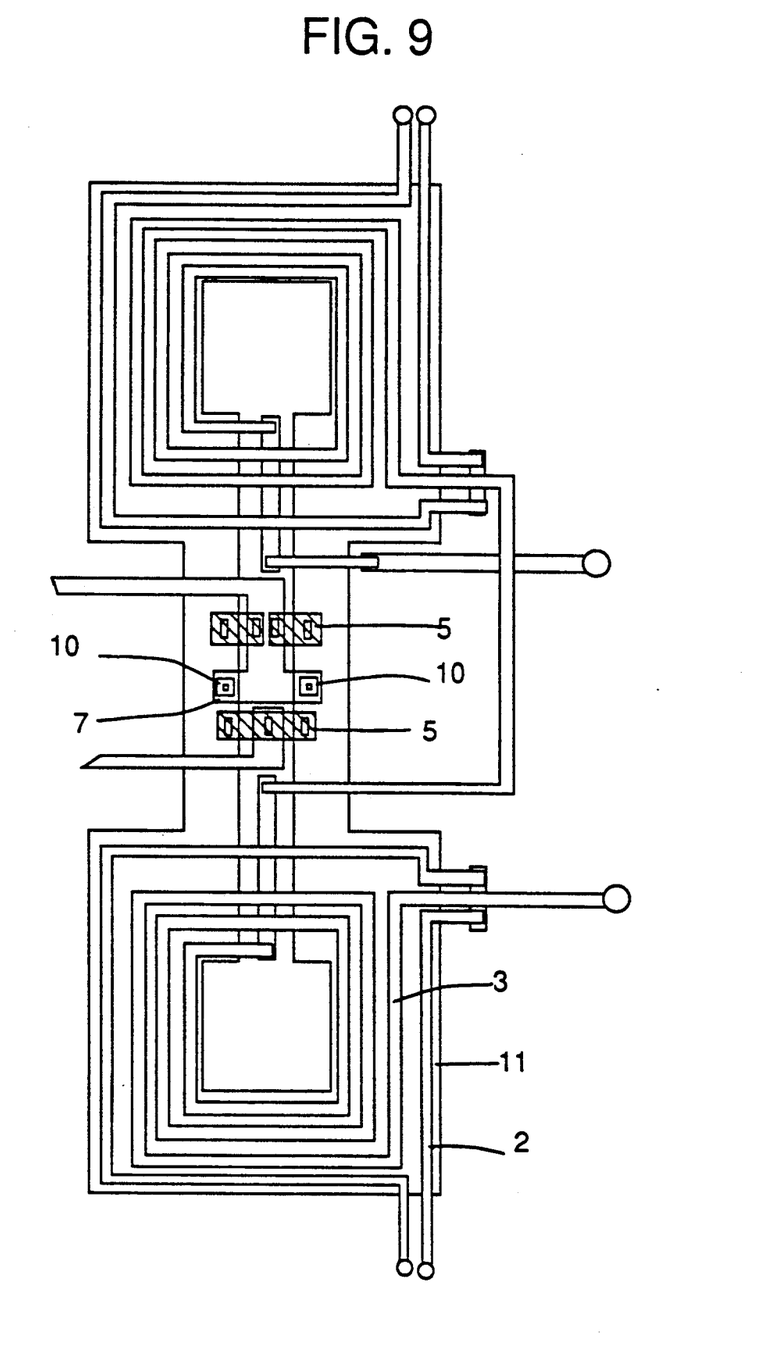
FIG. 9 is a top plan view of a DC-SQUID having double-washer coils connected in parallel.

FIG. 9 is a top plan view showing a DC-SQUID, in which washer coils are connected in parallel.

Figure 10:
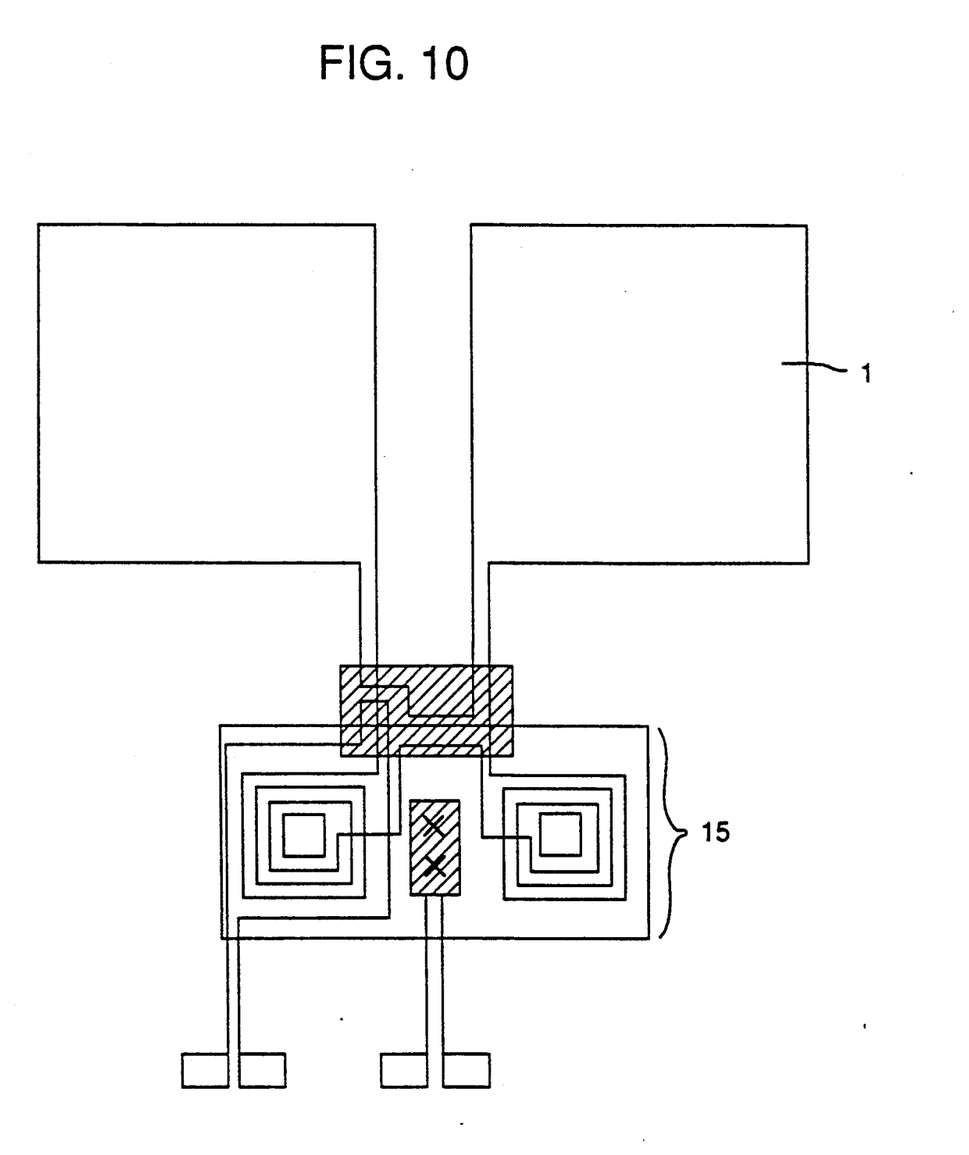
FIG. 10 is a top plan view showing a gradiometer DC-SQUID.

Moreover, a DC-SQUID of the gradiometer type for detecting a magnetic field gradient can also be manufactured, as shown in top plan view in FIG. 10. The components are a first-order differential type detection coil 1 and a DC-SQUID body 15, which is of the double-washer type of FIG. 8 or 9.

According to the present invention, it is possible to manufacture the DC-SQUID with a reduced number of masks and at a reduced number of steps and to manufacture a magnetic field detection circuit which has improved production yield and reproductivity.

What is claimed is:

1. In a process for manufacturing a DC superconducting quantum interference device having a pick-up coil for detecting a magnetic field to produce a signal current, an input coil superconductively coupled to said pick-up coil through two input terminals, a feedback coil for transmitting a signal coming from an external control system, a washer coil magnetically coupled to said input coil and said feedback coil for constituting a superconducting ring, and a Josephson junction connecting a counter electrode and said washer coil and sandwiching a barrier layer between a lower electrode and an upper electrode for converting said signal current into a voltage, the improvement comprising the steps of fabricating at least one of said Josephson junction and said counter electrode simultaneously with fabricating said input coil and said feedback coil by photolithographic patterning and etching a superconducting film.

2. A process for manufacturing a DC superconducting quantum interference device according to claim 1; wherein at least one of said input coil, said feedback coil and said washer coil is formed by an isotropic etching to have a tapered section.

3. A method of manufacturing a DC superconducting quantum interference device, comprising the steps of: forming a resistance film; forming an insulating film over a portion of the resistance film; forming a lower electrode superconducting film over the resistance film and the insulating film; forming a barrier layer on a portion of the lower electrode superconducting film; forming an upper electrode so as to sandwich the barrier layer between the lower electrode superconducting film and the upper electrode; and patterning the lower electrode superconducting film to simultaneously form an input coil, a feedback coil and a Josephson junction.

4. A method of manufacturing a DC superconducting quantum interference device according to claim 3; wherein the step of patterning the lower electrode superconducting film comprises photolithographically patterning and etching the lower electrode superconducting film.

5. A method of manufacturing a DC superconducting quantum interference device according to claim 3; wherein the step of patterning the lower electrode superconducting film further comprises simultaneously forming a detection coil with the input coil, the feedback coil and the Josephson junction.

6. A method of manufacturing a DC superconducting quantum interference device according to claim 3; further comprising the steps of forming an insulating film over the input coil, the feedback coil and at least a portion of the lower electrode superconducting film; forming a superconducting film over the insulating film; and patterning the superconducting film to form a washer coil and a counter electrode.

7. A method of manufacturing a DC superconducting quantum interference device according to claim 3; wherein the step of patterning the lower electrode superconducting film comprises patterning and isotropically etching the lower electrode superconducting film to form the input coil and the feedback coil having a tapered cross section.

8. A method of manufacturing a DC superconducting quantum interference device, comprising the steps of: forming a resistance film; forming an insulating film over a portion of the resistance film; forming a lower electrode superconducting film over the resistance film and the insulating film; forming a barrier layer on a portion of the lower electrode superconducting film; forming an upper electrode so as to sandwich the barrier layer between the lower electrode superconducting film and the upper electrode to form a Josephson junction; forming an insulating film over at least a portion of the lower electrode superconducting film; forming a superconducting film over the insulating film in contact with the upper electrode; and patterning the superconducting film formed over the insulating film to simultaneously form a counter electrode, an input coil and a feedback coil.

9. A method of manufacturing a DC superconducting quantum interference device according to claim 8; wherein the step of patterning the superconducting film comprises photolithographically patterning and etching the superconducting film formed over the insulating film.

10. A method of manufacturing a DC superconducting quantum interference device according to claim 8; wherein the step of patterning the superconducting film further comprises simultaneously forming a detection coil with the counter electrode, the input coil and the feedback coil.

11. A method of manufacturing a DC superconducting quantum interference device according to claim 8; further comprising the step of patterning the lower electrode superconducting film to form a washer coil.

12. A method of manufacturing a DC superconducting quantum interference device according to claim 11; wherein the step of patterning the lower electrode superconducting film comprises patterning and isotropically etching the lower electrode superconducting film to form the washer coil having a tapered cross section.

13. A method of manufacturing a DC superconducting quantum interference device according to claim 8; wherein the step of patterning the superconducting film comprises patterning and isotropically etching the superconducting film to form the input coil and the feedback coil having a tapered cross section.

* * * * *